US012805413B2

(12) United States Patent
Sakai et al.

(10) Patent No.: US 12,805,413 B2
(45) Date of Patent: Nov. 17, 2026

(54) SEMICONDUCTOR DEVICE

(71) Applicant: Mitsubishi Electric Corporation, Tokyo (JP)

(72) Inventors: Norikazu Sakai, Tokyo (JP); Fumihito Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 385 days.

(21) Appl. No.: 18/481,648

(22) Filed: Oct. 5, 2023

(65) Prior Publication Data

US 2024/0234271 A1 Jul. 11, 2024

(30) Foreign Application Priority Data

Jan. 5, 2023 (JP) ................................ 2023-000400

(51) Int. Cl.
*H01L 23/498* (2006.01)
*H10W 74/10* (2026.01)
(Continued)

(52) U.S. Cl.
CPC ........ *H10W 90/701* (2026.01); *H10W 74/114* (2026.01); *H10W 70/685* (2026.01);
(Continued)

(58) Field of Classification Search
CPC ............. H10W 90/701; H10W 74/114; H10W 70/685; H10W 72/884; H10W 90/734;
(Continued)

(56) References Cited

U.S. PATENT DOCUMENTS

| | | | |
|---|---|---|---|
| 2007/0035019 A1 | 2/2007 | Carney et al. | |
| 2010/0097775 A1 | 4/2010 | Kashiwazaki et al. | |
| 2012/0061816 A1* | 3/2012 | Song .................. | H01L 23/4334 257/E23.079 |

FOREIGN PATENT DOCUMENTS

| | | |
|---|---|---|
| JP | 2010-123914 A | 6/2010 |
| JP | 2012-023233 A | 2/2012 |

(Continued)

OTHER PUBLICATIONS

"Notice of Reasons for Refusal" Office Action issued in JP 2023-000400; mailed by the Japanese Patent Office on Mar. 3, 2026.

(Continued)

*Primary Examiner* — Cuong B Nguyen
(74) *Attorney, Agent, or Firm* — Studebaker Brackett PLLC

(57) ABSTRACT

An object is to provide a technique that suppresses peeling of a sealing resin that seals a semiconductor element by a simple method. A semiconductor device includes an insulating substrate provided with a front surface metal pattern a front surface thereof, a semiconductor element mounted on the front surface metal pattern, a wiring wire connected to the front surface electrode of the semiconductor element, a sealing resin that seals the insulating substrate and the semiconductor element, and at least one metal wire arranged around the semiconductor elements on and along the front surface metal pattern. The distance between the semiconductor element and the at least one metal wire is greater than the thickness of the semiconductor element.

10 Claims, 7 Drawing Sheets

(51) Int. Cl.
*H10W 90/00* (2026.01)
*H10W 70/685* (2026.01)
*H10W 72/00* (2026.01)

(52) U.S. Cl.
CPC ........ *H10W 72/884* (2026.01); *H10W 90/734* (2026.01); *H10W 90/753* (2026.01); *H10W 90/754* (2026.01)

(58) Field of Classification Search
CPC ............. H10W 90/753; H10W 90/754; H10W 90/751–759; H10W 72/015–01571; H05K 2203/049; H05K 2203/00–308
See application file for complete search history.

(56) References Cited

FOREIGN PATENT DOCUMENTS

| | | |
|---|---|---|
| JP | 2013-098456 A | 5/2013 |
| JP | 2015-211178 A | 11/2015 |

OTHER PUBLICATIONS

Office Action issued in DE 10 2023 130 705.3; mailed by the German Patent and Trade Mark Office on Jan. 22, 2026.

* cited by examiner

100B

SEMICONDUCTOR DEVICE

BACKGROUND OF THE INVENTION

Field of the Invention

The present disclosure relates to a semiconductor device.

Description of the Background Art

Japanese Patent Application Laid-Open No. 2015-211178 discloses that a structure in which a metal portion including a convex mounting portion having a mounting surface on which a semiconductor element is mounted in order to suppress peeling of a sealing resin that occurs between the semiconductor element sealed with the sealing resin and the sealing resin.

In the technique disclosed in Japanese Patent Application Laid-Open No. 2015-211178, the convex mounting portion is formed by cutting, casting, press working, or the like. However, the problem of the convex mounting portion being formed by any of those methods is processing effort and processing costs. It is from this backdrop that the demand for a simpler method for suppressing peeling of the sealing resin has been growing.

SUMMARY

An object of the present disclosure is to provide a technique that suppresses peeling of a sealing resin that seals a semiconductor element by a simple method.

The semiconductor device according to the present disclosure includes an insulating substrate, a semiconductor element, a wiring wire, a sealing resin, and at least one metal wire. The insulating substrate is provided with a metal pattern on a front surface. The semiconductor element is mounted on the metal pattern. The wiring wire is connected to an electrode of the semiconductor element. The sealing resin seals the insulating substrate and the semiconductor element. The at least one metal wire is arranged around the semiconductor element on and along the metal pattern. A distance between the semiconductor element and the at least one metal wire is greater than the thickness of the semiconductor element.

The adhesion strength between the sealing resin and the semiconductor element is enhanced by the anchor effect generated between the metal pattern and the sealing resin. Further, by securing a certain distance between the semiconductor element and the at least one metal wire, the entrapment of bubbles into the semiconductor element during the filling of the sealing resin caused by the at least one metal wire is suppressed without depending on the viscosity of the sealing resin. As described above, peeling of the sealing resin can be suppressed by a simple method of arranging the metal wires around the semiconductor element on and along the metal pattern.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
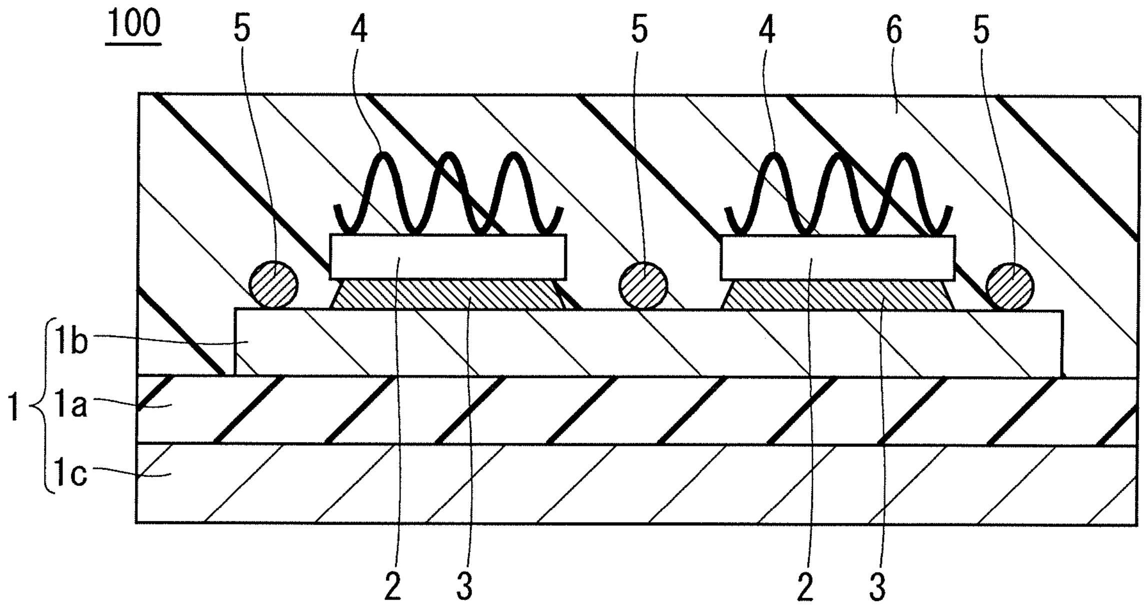
FIG. 1 is a cross-sectional view of a semiconductor device according to Embodiment 1.
Figure 2:
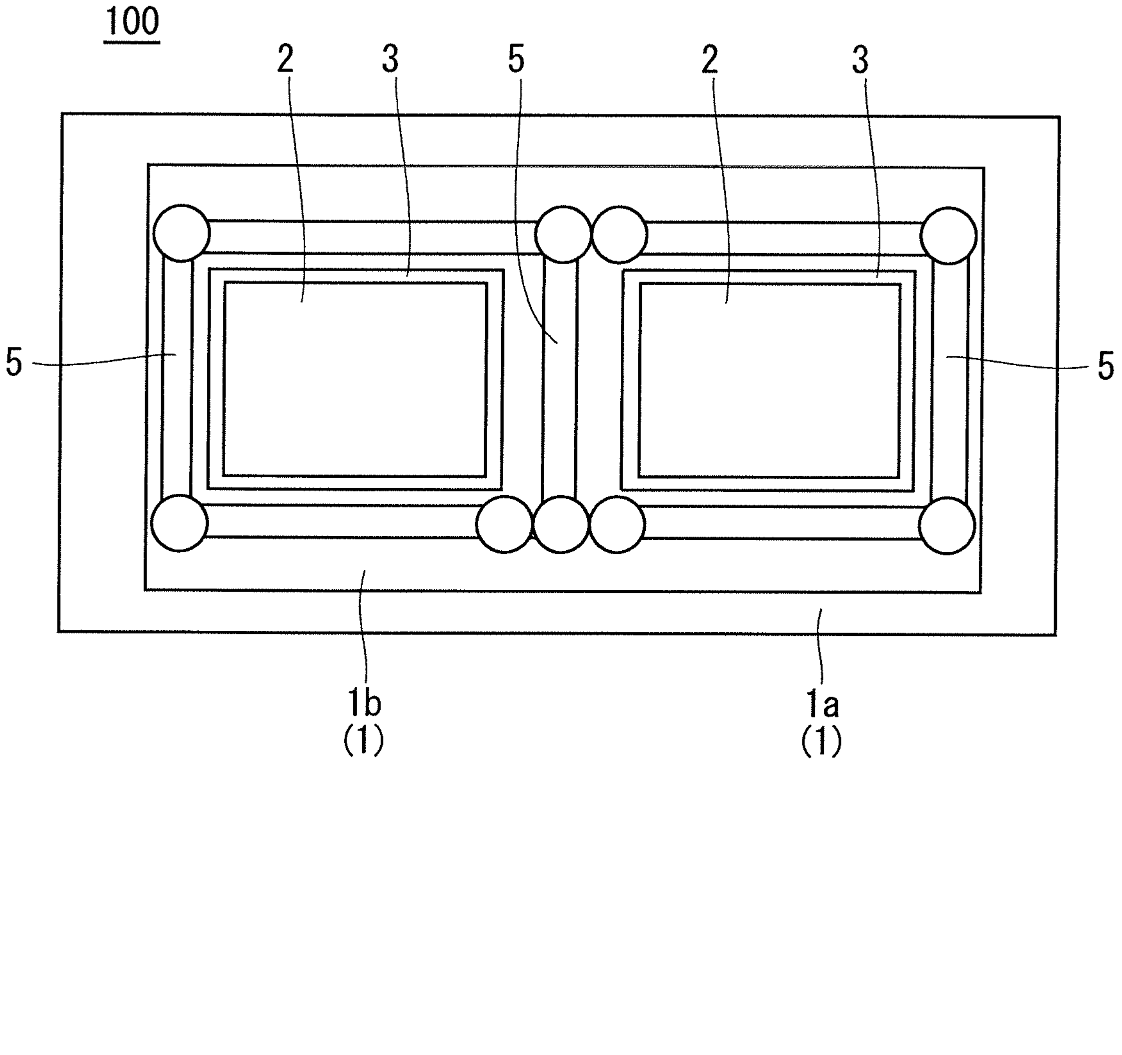
FIG. 2 is a top view of the semiconductor device according to Embodiment 1.
Figure 3:
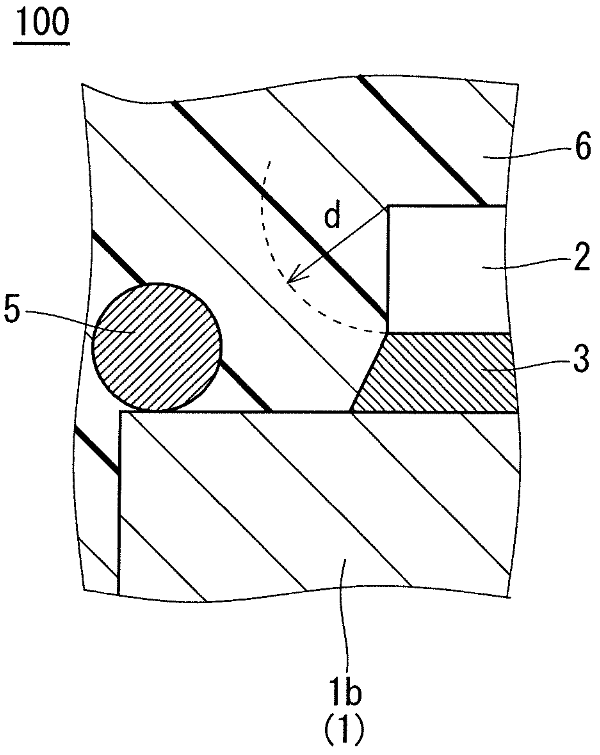
FIG. 3 is a cross-sectional view around a metal wire of the semiconductor device according to Embodiment 1.

Embodiment 1 will be described with reference to the drawings. FIG. 1 is a cross-sectional view of a semiconductor device 100 according to Embodiment 1. FIG. 2 is a top view of the semiconductor device 100 according to Embodiment 1. In FIG. 2, illustration of a wiring wire 4 and a sealing resin 6 is omitted for clarity. FIG. 3 is a cross-sectional view around a metal wire 5 of the semiconductor device 100 according to Embodiment 1.

As illustrated in FIGS. 1 and 2, the semiconductor device 100 is a power semiconductor device for power control, and includes an insulating substrate 1, two semiconductor elements 2, wiring wires 4, the metal wires 5, and a sealing resin. 6.

The insulating substrate 1 includes a ceramic substrate 1*a*, a front surface metal pattern 1*b*, and a rear surface metal pattern 1*c*. The ceramic substrate 1*a* is composed of ceramics such as $Al_2O_3$, AlN, and $Si_3N_4$. The front surface metal pattern 1*b* and the rear surface metal pattern 1*c* are made of, for example, a metal containing Cu as a main component.

The two semiconductor elements 2 are mounted on the front surface metal pattern 1*b* via a bonding material 3 such as solder. Each semiconductor element 2 is a power semiconductor element formed in a rectangular shape in top view and composed of, Si, SiC, or GaN, for example. Here, the front surface metal pattern 1*b* corresponds to a metal pattern on which the semiconductor elements 2 are mounted. Although two semiconductor elements 2 are illustrated in FIGS. 1 and 2, the number is not limited to two and one or more are sufficient.

A front surface electrode (for example, an emitter electrode or a gate electrode) of each semiconductor element 2 is connected to the wiring wire 4, and a rear surface electrode (for example, a collector electrode) of each semiconductor element 2 is electrically connected to the front surface metal pattern 1*b*.

The sealing resin 6 is composed of epoxy resin or the like, and seals the front surface metal pattern 1*b*, the two semiconductor elements 2, the wiring wires 4, and the metal wires 5.

Next, the metal wires 5 will be described. As illustrated in FIGS. 1 and 2, the metal wires 5 are arranged around each semiconductor element 2 on and along the front surface metal pattern 1*b*. Specifically, the metal wires 5 are arranged on and along the front surface metal pattern 1*b* around the four sides of each semiconductor element 2 so as to surround each semiconductor element 2 in top view.

Wiring tracing of general wiring bonding is required to be pulled up from the base material when transitioning from the start point to the end point, whereas, in the wiring tracing of wiring bonding of the metal wires 5, the height when pulled up from the front surface metal pattern 1*b*, which is the base material, is lower than the wiring tracing of the general wiring bonding, or is not pulled up from the front surface metal pattern 1*b*. This generates an anchor effect between the front surface metal pattern 1*b* and the sealing resin 6 when the sealing resin 6 is filled.

As illustrated in FIG. 3, the distance between the semiconductor element 2 and metal wire 5 is greater than the thickness of the semiconductor element 2. In other words, the metal wire 5 is arranged outside a region with a radius of a distance d, which is equal to the thickness of the semiconductor element 2 from the surface thereof. With this, the metal wire 5 can avoid the influence of the electric field from the semiconductor element 2. To avoid the influence of the electric field from the semiconductor 2, it is sufficient to secure a distance at least equal to the thickness of the semiconductor element 2, as the applied voltage varies depending on the thickness of the semiconductor element 2. This distance referred is typically between 30 μm and 700 μm. By securing a certain distance between the semiconductor element 2 and the metal wire 5, the entrapment of bubbles into the semiconductor element 2 during the filling of the sealing resin 6 caused by the metal wire 5 is suppressed without depending on the viscosity of the sealing resin 6.

The metal wire 5 may be pressed in order to adjust the height position of the metal wire 5 when the metal wire 5 is arranged. After that, when the sealing resin 6 is filled, the anchor effect generated between the front surface metal pattern 1*b* and the sealing resin 6 enhances the adhesion strength between the sealing resin 6 and the semiconductor element 2 which enables to suppress peeling and advance thereof of the sealing resin 6.

The metal wire 5 may be stitch wiring having a total length of 1.0 mm or more and the outer circumference length of the semiconductor element 2 +1.0 mm or less. The stitch wiring means connecting the metal wires 5 to the front surface metal pattern 1*b* at a plurality of points.

The metal wire 5 is a linear wire, and the diameter of the metal wire 5 is 50 μm or more and 600 μm or less. Also, the material of the metal wire 5 is Al, Cu, Ag, Au, or an alloy thereof, therefore, by selecting a material having a linear thermal expansion coefficient close to that of the front surface metal pattern 1*b*, which is the base material for bonding, peeling of the sealing resin 6 can be suppressed further.

Here, the metal wire 5 may also be a ribbon wire. In this case, the width of the metal wire 5 is 0.6 mm or more and 2.3 mm or less, and the thickness of the metal wire 5 is 0.1 mm or more and 0.3 mm or less. The contact area between the metal wire 5 and the sealing resin 6 becomes larger than when the metal wire 5 is a linear wire, the anchor effect generated between the front surface metal pattern 1*b* and the sealing resin 6 is enhanced.

As described above, the semiconductor device 100 according to Embodiment 1 includes the insulating substrate 1 provided with the front surface metal pattern 1*b* the front surface thereof, the semiconductor elements 2 mounted on the front surface metal pattern 1*b*, the wiring wires 4 connected to the front surface electrodes of the semiconductor elements 2, the sealing resin 6 that seals the insulating substrate 1 and the semiconductor elements 2, and the metal wires 5 arranged around the semiconductor elements 2 on and along the front surface metal pattern 1*b*. The distance between the semiconductor element 2 and the metal wire 5 is greater than the thickness of the semiconductor element 2.

With this configuration, the adhesion strength between the sealing resin 6 and the semiconductor elements 2 is enhanced by the anchor effect generated between the front surface metal pattern 1*b* and the sealing resin 6. Further, by securing a certain distance between the semiconductor element 2 and the metal wire 5, the entrapment of bubbles into the semiconductor element 2 during the filling of the sealing resin 6 caused by the metal wire 5 is suppressed without depending on the viscosity of the sealing resin 6. As described above, peeling of the sealing resin 6 can be suppressed by a simple method of arranging the metal wires 5 around the semiconductor elements 2 on and along the front surface metal pattern 1*b*.

Further, the semiconductor element 2 is formed in a rectangular shape in top view, and the metal wires 5 are arranged around the four sides of the semiconductor element 2. Therefore, by annularly arranging the metal wires 5 around each semiconductor element 2, the anchor effect is exerted to peeling of the sealing resin 6 from all directions around the semiconductor elements 2.

Also, the metal wire 5 is a linear wire, and the diameter of the metal wire 5 is 50 μm or more and 600 μm or less. Therefore, by changing the diameter of the metal wire 5, the height position of the metal wire 5 can be adjusted in a state where the metal wire 5 is arranged, so that the processing cost of the metal wire 5 can be reduced.

Further, the metal wire 5 is a ribbon wire, the width of the metal wire 5 is 0.6 mm or more and 2.3 mm or less, and the thickness of the metal wire 5 is 0.1 mm or more and 0.3 mm or less. Accordingly, the contact area between the metal wire 5 and the sealing resin 6 becomes larger than when the metal wire 5 is a linear wire; therefore, the anchor effect generated between the front surface metal pattern 1*b* and the sealing resin 6 is enhanced which enables to suppress peeling of the sealing resin 6 further.

Also, the material of the metal wire 5 is Al, Cu, Ag, Au, or an alloy thereof. Therefore, by selecting a material having a linear thermal expansion coefficient close to that of the front surface metal pattern 1*b*, which is the base material for bonding, peeling of the sealing resin 6 can be suppressed further.

Embodiment 2

Figure 4:
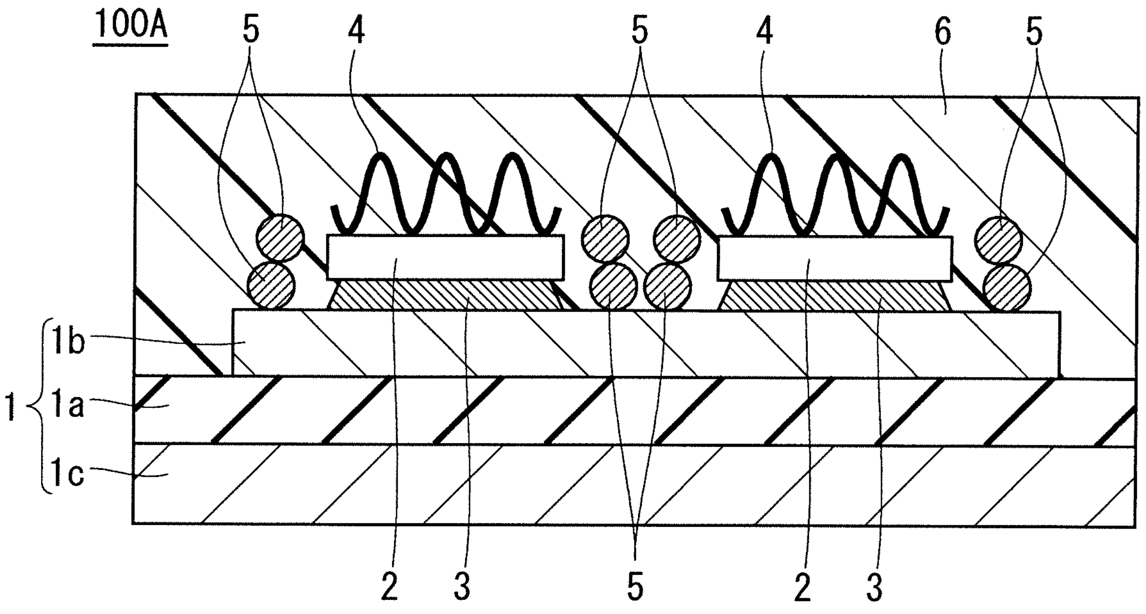
FIG. 4 is a cross-sectional view of a semiconductor device according to Embodiment 2.
Figure 5:
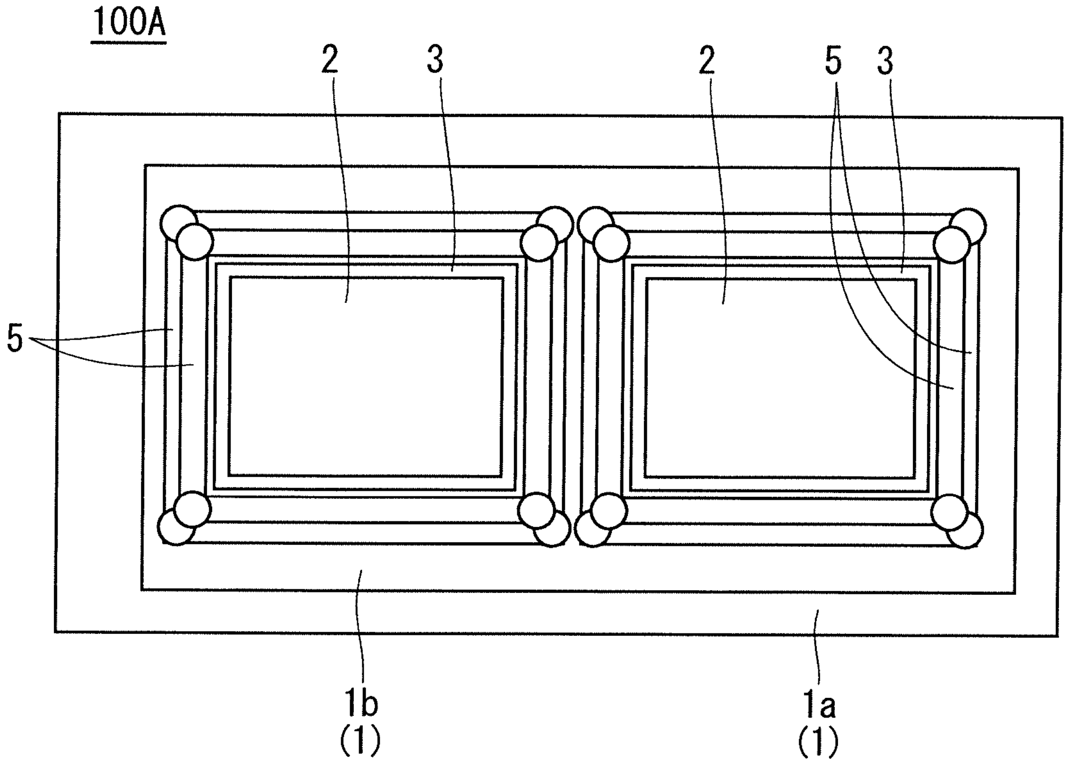
FIG. 5 is a top view of the semiconductor device according to Embodiment 2.
Figure 6:
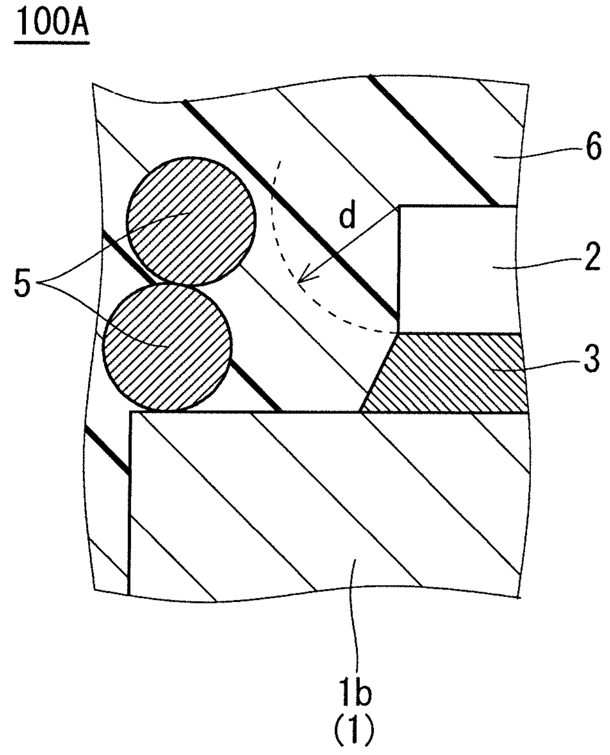
FIG. 6 is a cross-sectional view around metal wires of the semiconductor device according to Embodiment 2.

Next, a semiconductor device 100A according to Embodiment 2 will be described. FIG. 4 is a cross-sectional view of the semiconductor device 100A according to Embodiment 2. FIG. 5 is a top view of the semiconductor device 100A according to Embodiment 2. In FIG. 5, illustration of a wiring wire 4 and a sealing resin 6 is omitted for clarity. FIG. 6 is a cross-sectional view around wires 5 of the semiconductor device 100A according to Embodiment 2. In Embodiment 2, the same components as those described in Embodiment 1 are denoted by the same reference numerals and the description thereof will be omitted.

As illustrated in FIGS. 4, 5, and 6, the metal wires 5 are stacked in two tiers in Embodiment 2. Of the metal wires 5 stacked in two tiers, the metal wires 5 in the upper tier are arranged closer to the semiconductor element 2 than the metal wires 5 in the lower tier are. Also, the metal wires 5 in the upper tier are arranged in contact with the metal wires 5 in the lower tier. In the step of arranging the metal wires 5, the metal wires 5 in the upper tier are arranged after the metal wires 5 in the lower tier are arranged. Due to this structure, the two-tiered pyramid-like metal wires 5 are arranged from the periphery of the mounting position of the semiconductor element 2 towards the mounting location per se on the front surface metal pattern 1*b*. This arrangement further improves the anchoring effect that generates between the front surface metal pattern 1*b* and the sealing resin 6.

Note that the metal wires 5 are not limited to two tiers, and may be stacked in two or more tiers. Specifically, when the thickness of the semiconductor element 2 is 100 μm and the thickness of the bonding material 3 is 100 μm, four tiers can be arranged in the height direction with the metal wires 5 with a diameter of 50 μm. The structure is effective in suppressing peeling of the sealing resin 6 with the three-tiered undercut shape provided unlike the one-tiered metal wires 5 having a diameter of 200 μm. The metal wire 5 may also be a ribbon wire other than a linear wire.

As described above, in the semiconductor device 100A according to Embodiment 2, the metal wires 5 are stacked into two tiers or more. Specifically, the metal wires 5 include the upper metal wires 5 and the lower metal wires 5, and the upper metal wires 5 are arranged closer to the semiconductor element 2 than the lower metal wires 5 are. This further improves the anchor effect generated between the front surface metal pattern 1*b* and the sealing resin 6 and further suppresses peeling of the sealing resin 6.

Embodiment 3

Figure 7:
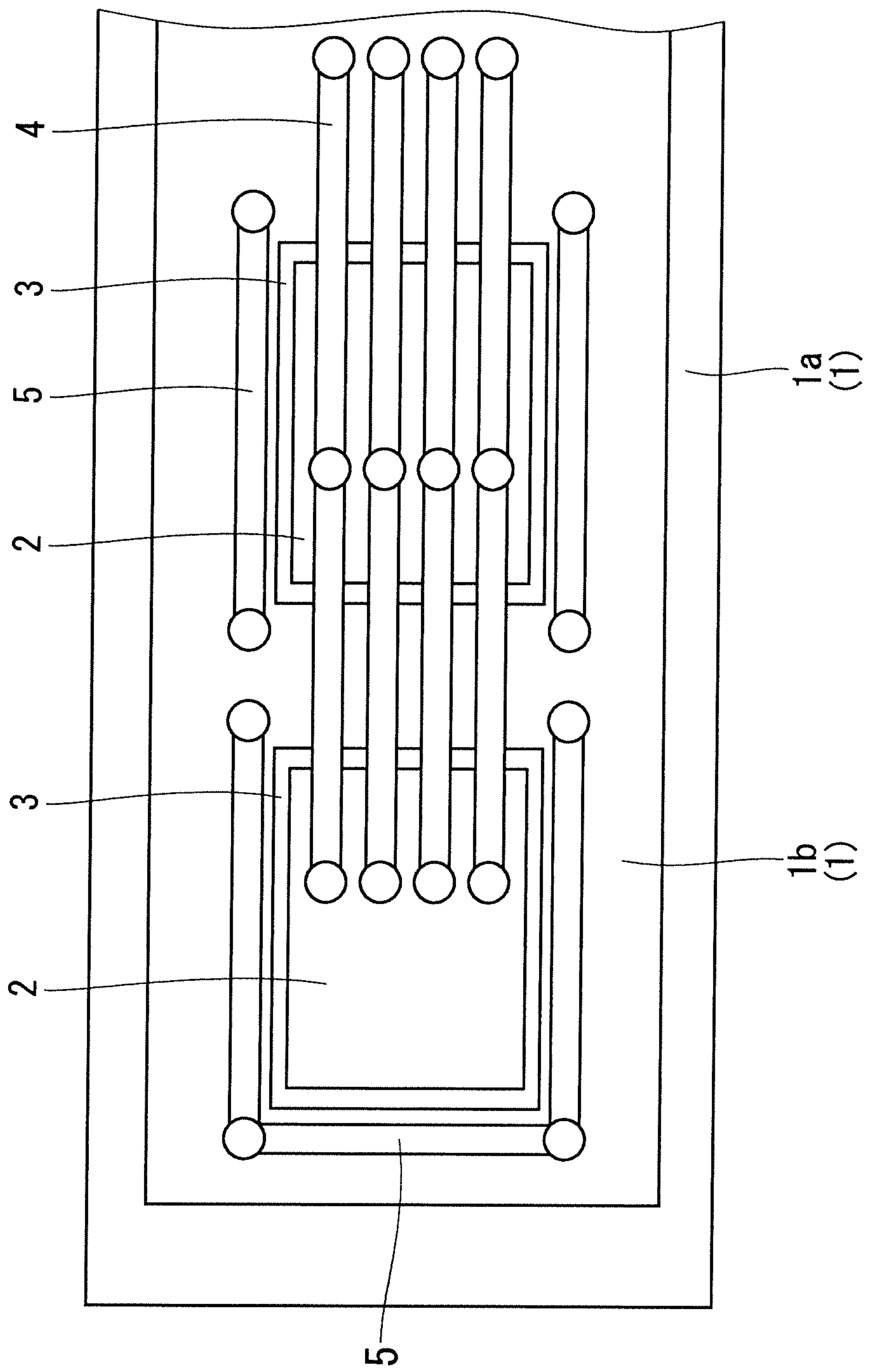
FIG. 7 is a top view of a semiconductor device according to Embodiment 3.

Next, a semiconductor device 100B according to Embodiment 3 will be described. FIG. 7 is a top view of the semiconductor device 100B according to Embodiment 3. In FIG. 7, illustration of a wiring wire 4 and a sealing resin 6 is omitted for clarity. In Embodiment 3, the same components as those described in Embodiments 1 and 2 are denoted by the same reference numerals and the description thereof will be omitted.

As illustrated in FIG. 7, in Embodiment 3, the metal wire 5 is arranged around at least one side of the semiconductor element 2. Specifically, the metal wires 5 are arranged around three sides of the semiconductor element 2 on the left side and around two sides of the semiconductor element 2 on the right side in FIG. 7.

The semiconductor element 2 on the left side, arranged at the far end of the front surface metal pattern 1*b*, is most susceptible to thermal expansion and, further, the longer sides of the front surface metal pattern 1*b* (the sides extending to the left and right in FIG. 7) are also susceptible to the effect of thermal expansion, which makes these positions prone to peeling of the sealing resin 6. In order to suppress the peeling of the sealing resin 6, the metal wires 5 are arranged around the periphery of one side on the far end of the front surface metal pattern 1*b* and two sides on the longer side of the front surface metal pattern 1*b* for the semiconductor element 2 on the left side and, for the semiconductor element 2 on the right side, the metal wires 5 are arranged around the periphery of two sides on the longer side of the front surface metal pattern 1*b*.

Note that the metal wires 5 may also be arranged only around one side of the semiconductor element 2 that is most susceptible to thermal expansion. The metal wire 5 may also be a ribbon wire other than a linear wire. Further, the metal wires 5 may also be stacked in two or more tiers.

As described above, in the semiconductor device 100B according to Embodiment 3, the metal wire 5 is arranged around at least one side of the semiconductor element 2. Therefore, peeling of the sealing resin 6 can be suppressed without impairing the degree of freedom in designing the semiconductor device 100B.

It should be noted that Embodiments can be arbitrarily combined and can be appropriately modified or omitted.

Hereinafter, the aspects of the present disclosure will be collectively described as Appendices.

APPENDIX 1

A semiconductor device comprising:

an insulating substrate provided with a metal pattern on a front surface;

a semiconductor element mounted on the metal pattern;

a wiring wire connected to an electrode of the semiconductor element;

a sealing resin sealing the insulating substrate and the semiconductor element; and at least one metal wire arranged around the semiconductor element on and along the metal pattern, wherein a distance between the semiconductor element and the at least one metal wire is greater than a thickness of the semiconductor element.

APPENDIX 2

The semiconductor device according to Appendix 1, wherein the semiconductor element is formed in a rectangular shape in top view, the at least one metal wire includes a plurality of metal wires, and the plurality of metal wires are arranged around four sides of the semiconductor element.

APPENDIX 3

The semiconductor device according to Appendix 1 or 2, wherein the at least one metal wire includes a plurality of metal wires, and the plurality of metal wires are stacked in two or more tiers.

APPENDIX 4

The semiconductor device according to Appendix 3, wherein the plurality of metal wires include the at least one the metal wire in an upper tier and the at least one metal wire in a lower tier, and the at least one metal wire in the upper tier is arranged closer to the semiconductor element than the at least one metal wire in the lower tier is.

APPENDIX 5

The semiconductor device according to any one of Appendices 1, 3, and 4, wherein the semiconductor element is formed in a rectangular shape in top view, and the at least one metal wire is arranged around at least one side of the semiconductor element.

APPENDIX 6

The semiconductor device according to any one of Appendices 1 to 5, wherein the at least one metal wire is a linear wire, and a diameter of the at least one metal wire is 50 μm or more and 600 μm or less.

APPENDIX 7

The semiconductor device according to any one of Appendices 1 to 5, wherein the at least one metal wire is a ribbon wire, a width of the at least one metal wire is 0.6 mm or more and 2.3 mm or less, and a thickness of the at least one metal wire is 0.1 mm or more and 0.3 mm or less.

APPENDIX 8

The semiconductor device according to any one of Appendices 1 to 7, wherein a material of the at least one metal wire is Al, Cu, Ag, Au, or an alloy thereof.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:

an insulating substrate provided with a metal pattern on a front surface;

a semiconductor element mounted on the metal pattern;

a wiring wire connected to an electrode of the semiconductor element;

a sealing resin sealing the insulating substrate and the semiconductor element; and at least one metal wire arranged around the semiconductor element on and along the metal pattern, wherein a distance between the semiconductor element and the at least one metal wire is greater than a thickness of the semiconductor element.

2. The semiconductor device according to claim 1, wherein the semiconductor element is formed in a rectangular shape in top view, and the at least one metal wire includes a plurality of metal wires, and the plurality of metal wires are arranged around four sides of the semiconductor element.

3. The semiconductor device according to claim 1, wherein the at least one metal wire includes a plurality of metal wires, and the plurality of metal wires are stacked in two or more tiers.

4. The semiconductor device according to claim 3, wherein the plurality of metal wires include a first metal wire in an upper tier and a second metal wire in a lower tier, and the first metal wire in the upper tier is arranged closer to the semiconductor element than the second metal wire in the lower tier is.

5. The semiconductor device according to claim 1, wherein the semiconductor element is formed in a rectangular shape in top view, and the at least one metal wire is arranged around at least one side of the semiconductor element.

6. The semiconductor device according to claim 1, wherein the at least one metal wire is a linear wire, and a diameter of the at least one metal wire is 50 μm or more and 600 μm or less.

7. The semiconductor device according to claim 1, wherein the at least one metal wire is a ribbon wire, a width of the at least one metal wire is 0.6 mm or more and 2.3 mm or less, and a thickness of the at least one metal wire is 0.1 mm or more and 0.3 mm or less.

8. The semiconductor device according to claim 1, wherein a material of the at least one metal wire is Al, Cu, Ag, Au, or an alloy thereof.

9. The semiconductor device according to claim 4, wherein the upper tier includes a first plurality of metal wires including the first metal wire, and the lower tier includes a second plurality of metal wires including the second metal wire.

10. The semiconductor device according to claim 4, wherein the first metal wire is different from the second metal wire.

* * * * *